United States Patent [19]

Chrysler et al.

[11] Patent Number: 5,456,081
[45] Date of Patent: Oct. 10, 1995

[54] THERMOELECTRIC COOLING ASSEMBLY WITH OPTIMIZED FIN STRUCTURE FOR IMPROVED THERMAL PERFORMANCE AND MANUFACTURABILITY

[75] Inventors: Gregory M. Chrysler; Richard C. Chu; Robert E. Simons, all of Poughkeepsie, N.Y.; DAvid T. Vader, Mechanicsburg, Pa.

[73] Assignee: International Business Machines Corporation, Armonk, N.Y.

[21] Appl. No.: 222,150

[22] Filed: Apr. 1, 1994

[51] Int. Cl.$^6$ ................................. H01L 35/28
[52] U.S. Cl. ................ 62/3.7; 62/259.2; 165/80.2; 165/185; 136/204
[58] Field of Search .............. 62/3.2, 3.7, 259.2; 136/204, 230; 165/80.2, 185

[56] References Cited

U.S. PATENT DOCUMENTS

| | | | |
|---|---|---|---|
| 2,815,472 | 12/1957 | Jackson et al. | 165/185 |
| 2,965,819 | 12/1960 | Rosenbaum | 165/185 |
| 2,984,077 | 5/1961 | Gaskill | 62/3.2 |
| 2,994,203 | 8/1961 | Lackey et al. | 62/3.2 |
| 4,664,309 | 5/1987 | Allen et al. | 228/180.2 |
| 4,770,242 | 9/1988 | Daikoku et al. | 165/185 |
| 4,800,956 | 1/1989 | Hamburgen | 165/185 |
| 5,232,516 | 8/1993 | Hed | 136/204 |
| 5,276,584 | 1/1994 | Collins et al. | 361/718 |

*Primary Examiner*—Henry A. Bennet
*Assistant Examiner*—William C. Doerrler
*Attorney, Agent, or Firm*—Lawrence D. Cutter

[57] ABSTRACT

A configuration of solid state thermoelectric heat transfer or removal elements is provided to enhance the rate and amount of heat removal from electrical and electronic circuit devices. By rotating the thermoelectric heat transfer modules ninety degrees and by disposing them between the interdigitated fingers of a cold plate and a heat transfer plate possessing fins, improved thermal transfer is produced without the necessity of liquid coolants or moving part cooling devices. Accordingly, a method and apparatus is provided for enhancing heat transfer using thermoelectric modules. One embodiment of the present invention is particularly seen to be easy to manufacture. Additionally, this embodiment also possesses desirable heat transfer characteristics in terms of the cross sections of thermally conductive components.

3 Claims, 4 Drawing Sheets

THERMOELECTRIC COOLING ASSEMBLY WITH OPTIMIZED FIN STRUCTURE FOR IMPROVED THERMAL PERFORMANCE AND MANUFACTURABILITY

BACKGROUND OF THE INVENTION

The present invention is directed to cooling assemblies and other apparatus used for removing heat from electronic devices. More particularly, the present invention is directed to an apparatus for cooling an electronic module through the utilization of thermoelectric cooling elements. Even more particularly, the present invention is directed to a geometric arrangement and configuration of thermoelectric module cooling elements in relation to heat transfer structures which may be placed in contact with an electronic device which is to be cooled.

It is well known that as the circuit density of electronic chip devices increases, there is a correspondingly increasing demand for the removal of heat generated by these devices. The increased heat demand has arisen both because the circuit devices are packed more closely together and because the circuits themselves are operated at increasingly high clock frequencies. Nonetheless, it is also known that runaway thermal conditions and excessive heat generated by chips is a leading cause for failure of chip devices. Furthermore, it is anticipated that the demand for heat removal for these devices will increase indefinitely. Accordingly, it is seen that there is a large and significant need to provide useful cooling mechanisms for electronic circuit devices.

The use of thermoelectric cooling elements is known. These elements operate electronically to produce a cooling effect. By passing a direct current through the legs of the thermoelectric module, a temperature difference is produced across the module which is contrary to that which would be expected from Fourier's Law.

At one junction of the thermoelectric element both holes and electrons move away, toward the other junction, as a consequence of the current flow through the junction. Holes move through the p-type material and electrons through the n-type material. To compensate for this loss of charge carriers, additional electrons are raised from the valence band to the conduction band to create new pairs of electrons and holes. Since energy is required to do this, heat is absorbed at this junction. Conversely, as an electron drops into a hole at the other junction, its surplus energy is released in the form of heat. This transfer of thermal energy from the cold junction to the hot junction is known as the Peltier effect.

This permits the surfaces attached to a heat source to be maintained at a temperature below that of a surface attached to a heat sink. What these thermoelectric modules provide is the ability to operate the cold side below the ambient temperature of the cooling medium (air or water) or provide greater heat removal capacity for a given cold plate or component temperature. When direct current is passed through these thermoelectric modules a temperature difference is produced with the result that one side is relatively cooler than the other side. These thermoelectric modules are therefore seen to possess a hot side and a cold side. These devices provide a mechanism for facilitating the transfer of thermal energy from the cold side of the thermoelectric module to the hot side of the module.

However, conventional configurations of these devices are nonetheless seen to be unnecessarily limiting in terms of the thermal energy which may be transferred. Thus while the use of thermoelectric modules is seen to provide a means for the solid state cooling of adjacent electrical devices, their efficiency has been less than optimal.

SUMMARY OF THE INVENTION

In accordance with the preferred embodiment of the present invention an apparatus for cooling an electronic device comprises a cold plate, a heat removal plate and a set of thermoelectric heat removal elements. The cold plate possesses a flat surface for contacting the electronic device to be cooled. On the opposite side thereof, there are provided however a plurality of flat-faced surface protrusions. Correspondingly, the heat removal plate also possesses mating flat-faced protrusions which are preferably disposed in an interdigitated arrangement with protrusions on the cold plate. The heat removal plate also possesses fins (or other high surface area heat transfer structures) on the side opposite its protrusions. Lastly, thermoelectric heat removal elements are disposed between the corresponding protrusions of the cold plate and heat removal plate. The thermoelectric modules are configured and/or powered so that their cold sides are in thermal contact with flat portions of the protrusions on the cold plate; correspondingly, their hot sides are in thermal contact with flat surfaces on the protrusions found on the heat removal plate.

In a particularly preferred embodiment of the present invention the protrusions possess a triangular (as opposed to rectangular) cross-section. This cross-section is more thermodynamically matched to the operation of these devices and still further provides advantages for manufacturability. More particularly, the present invention provides a mechanism for utilizing a significantly increased number of thermoelectric modules for a given chip area. Accordingly, the heat transfer characteristics are correspondingly increased, typically by a factor approximately two and one half times.

Accordingly, it is seen that it is an object of the present invention to provide increased cooling capabilities for electronic chip circuit devices and other electrical devices.

It is also an object of the present invention to permit electronic circuit chip devices to operate at increased power levels and with increasingly faster cycle times.

It is yet another object of the present invention to provide a heat transfer mechanism which is consistent with conductive heat transfer at various positions along the protrusions, particularly as measured in terms of distance from the heat source.

It is a still further object of the present invention to provide a cooling mechanism which does not depend upon the flow of a liquid coolant or upon moving part mechanisms.

It is still another object of the present invention to provide a cooling apparatus for chips or arrays of chips through the utilization of solid state mechanisms without the concomitant reliability problems associated with mechanisms having moving parts.

It is also an object of the present invention to maintain electronic modules to be cooled at a lower temperature or correspondingly to increase their power dissipation without increasing component temperature.

Lastly, but not limited hereto, it is an object of the present invention to provide an enhanced mechanism for cooling electronic circuit chips and chip arrays in a wide range of computer devices.

DETAILED DESCRIPTION OF THE INVENTION

Figure 1:
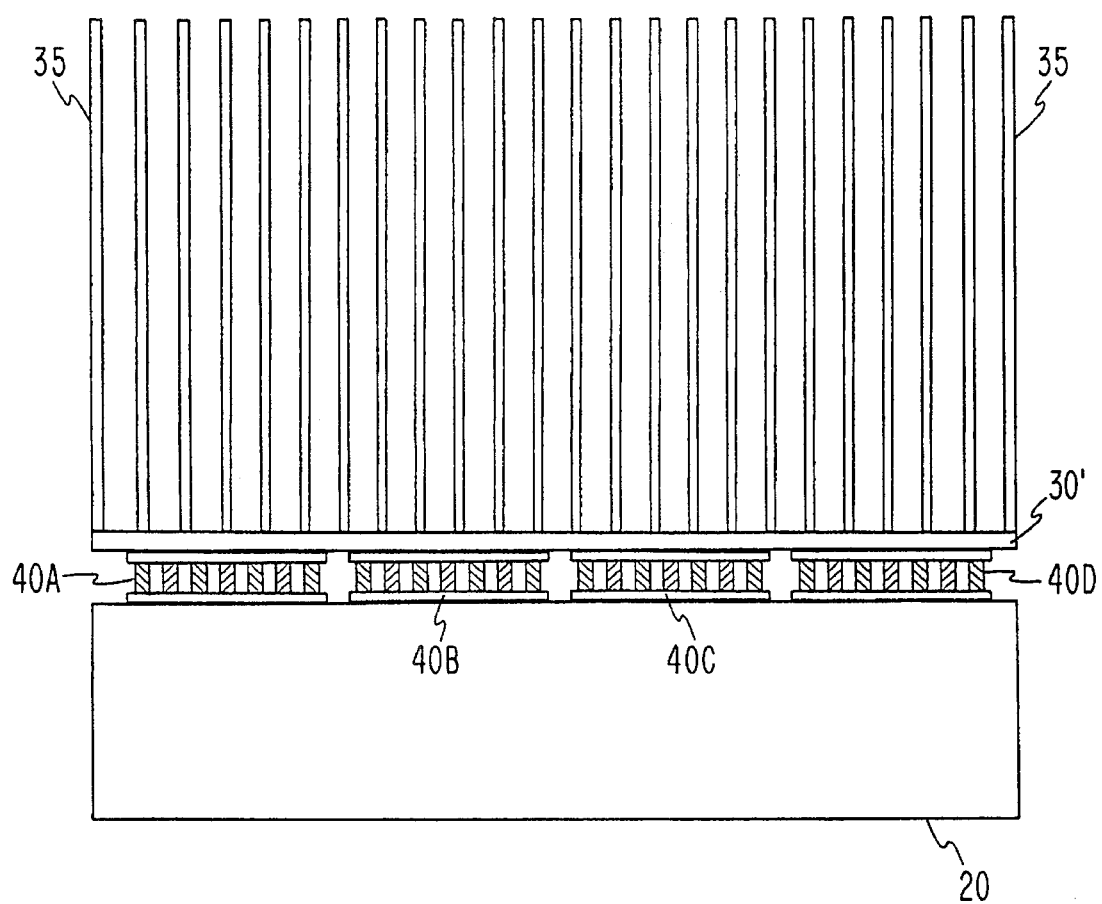
FIG. 1 is a side elevation view illustrating an arrangement of thermoelectric cooling modules employed to cool an electronic device.

FIG. 1 illustrates an arrangement for the cooling of electronic module 20 using thermoelectric modules 40a, 40b, 40c and 40d. The cold sides of thermoelectric modules 40a–40d are disposed in contact with module 20. Correspondingly, the hot side of thermoelectric modules 40 are disposed so as to be in contact with thermal transfer (heat removal) plate 30 which possesses finned structures 35. The example of FIG. 1 illustrates however that, for the configuration shown, an electronic module with a square planform area can accommodate no more than sixteen square thermoelectric modules of the size shown. Since the number of thermoelectric modules is thus limited, it is seen that desirable heat transfer properties are also limited.

Figure 2:
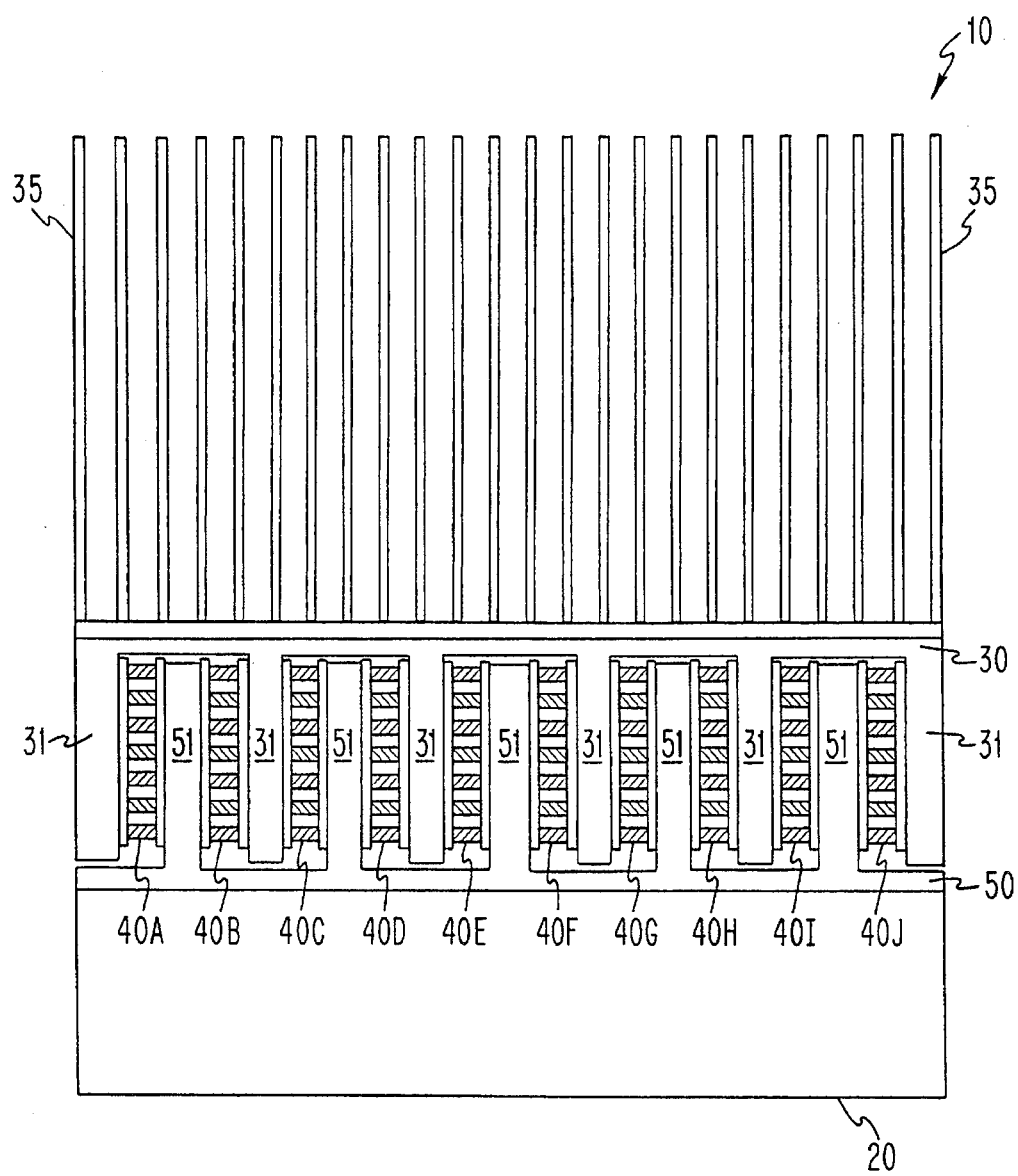
FIG. 2 is a side elevation view illustrating one embodiment of the present invention in which thermoelectric modules are disposed between the interdigitated fingers of a cold transfer plate and a hot transfer plate.

FIG. 2 illustrates one embodiment of the present invention in which cold plate 50, having protrusions 51, is disposed so as to be in thermal contact with electronic module or electrical device 20 which is to be cooled. In addition, it is seen that thermal transfer or heat removal plate 30 also possesses flat-faced protrusions 31 which are configured in an interdigitated arrangement with protrusions 51 of cold plate 50. Additionally, it is seen that thermoelectric modules 40a through 40j are disposed so that each is in contact with a protrusion from plate 50 and plate 30. Thermal transfer plate 30 is also seen to possess high surface area heat transfer structures (fins, e.g.) for rejection of heat into the air. It is nonetheless noted however that heat rejected from fins 35 may be rejected into any convenient coolant fluid including ambient air, flowing air or even a static or flowing liquid stream.

Figure 3:
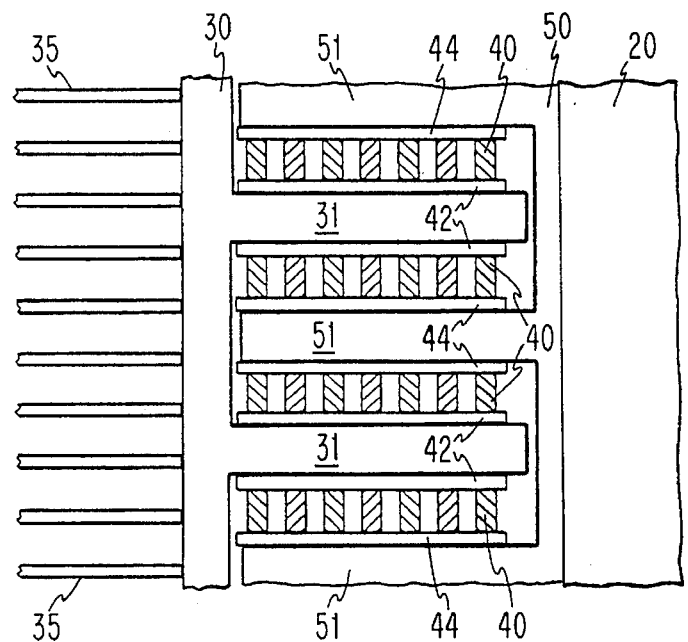
FIG. 3 is a side elevation view showing an arrangement of the thermoelectric modules in terms of the orientation of their hot sides and their cold sides.

In order to better appreciate the arrangement of protrusions, thermoelectric modules and plates, attention is directed to FIG. 3 in which the arrangement of the hot sides and the cold sides of the thermoelectric modules is shown. In particular, it is shown that cold side 44 of each thermoelectric module is disposed so as to be in contact with cold plate 50 through protrusions 51. Likewise, hot side 42 of each thermoelectric module 40 is shown to be in contact with heat removal or transfer plate 30 through protrusions 31. In this way, when a current is passed through thermoelectric modules 40 the transfer of heat from cold plate 50 to heat removal plate 30 is enhanced. This arrangement insures that all cold surfaces are attached to the cold transfer plate and all the hot surfaces are attached to the hot transfer plate thereby preventing thermal short circuits. Heat flows from electronic component 20 via cold plate 50 to cold surface 44 of each thermoelectric module. Heat is then electronically pumped across thermoelectric modules 40 to hot side 42. From hot side 42 of each thermoelectric module 40, heat flows via hot transfer plate 30 to a heat sink where it may be removed by any convenient cooling fluid.

In particular, with reference to FIG. 2, it is appreciated that in this example, for the same size module with the same square planform dimensions as discussed earlier, as many as ten thermoelectric modules may be assembled across the width of the electronic module, thus providing a total of forty thermoelectric modules in the completed assembly. This represents a two and one half times increase in the number of thermoelectric modules which can be employed. This also results in a proportionate augmentation of cooling capability.

Figure 4:
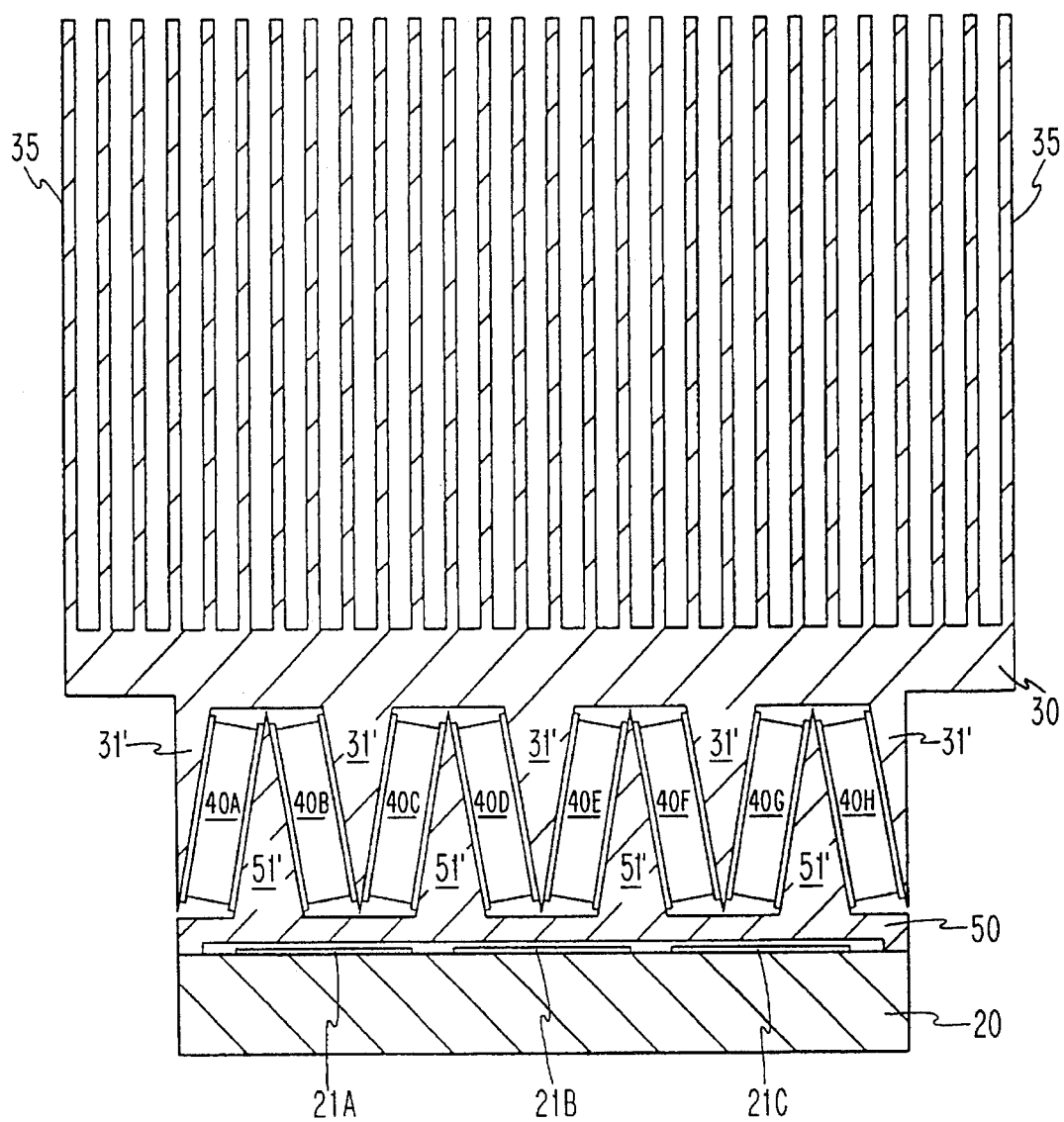
FIG. 4 is a side elevation view illustrating an alternate embodiment of the present invention which is particularly easy to manufacture and which also takes advantage of thermal conduction cross-sections.

An alternate and preferred embodiment of the present invention is shown in FIG. 4. In this structure it is seen that protrusions 51' from cold plate 50 and protrusions 31' from heat transfer plate 30 possess triangular cross sections. Thus it is seen that cold plate 50 possesses triangularly shaped protrusions 51' while heat transfer plate 30 possesses similar triangularly shaped protrusions 31'. The tapering of these fins provides a number of significant advantages over fins having a rectangular cross section. The triangular fin is a more efficient shape for conduction of thermal energy. This is because, as one traverses up cold plate protrusions 51', the area for conduction decreases along with the decreasing level of thermal energy which is conducted up protrusions 51' to the thermoelectric modules. On cold side protrusions 31', the opposite is true. Traversing up hot side protrusions 31', the increasing amount of thermal energy which needs to be conducted to plate 30 is accepted by a thermal conductor having an increasing cross sectional area. This provides a much better thermal conduction transfer match. In particular, the distance between electronic module 20 (with chips 21a, 21b, and 21c) and heat transfer plate 30 is reduced, thereby reducing the effective distance the thermal energy must travel. This also makes the total assembly more compact.

Additionally, with the structure shown in FIG. 4, the process of assembly is greatly simplified and tolerance requirements are greatly reduced. With thermoelectric modules 40 attached, for example by thermally conductive grease or epoxy, to the cold side fins, the hot fins and the heatsink structure can be attached by pressing vertically downward. The hot fins easily fit in between the thermoelectric modules attached to the cold fins.

Figure 5:
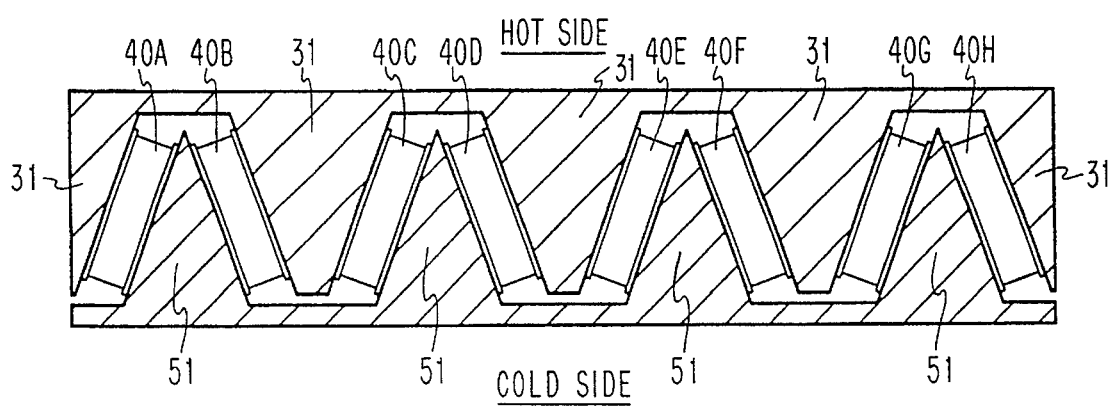
FIG. 5 is a side elevation view illustrating varient Finger protrusion shapes and sizes.

Attention is now directed to FIG. 5.

The protrusions, while preferably being generally triangular in shape, do not have to be completely triangular. Better heat transfer is provided by truncated triangles since this allows a thicker protrusion at the tip of the cold side and base of the hot side. Also, the angle of the triangles is shown larger than what is preferred. Narrower angles tend to force the use of truncated triangles in order to avoid clearance problems.

It should also be pointed out that the hot side flat protrusions need not be the same size as the cold side protrusions. In fact, in order to optimize heat transfer, the hot side protrusions are preferably thicker than the cold side protrusions. This is because the hot side protrusions have to conduct more heat than the cold side protrusions (the cold side conducts the heat from the electronics module—the chips, while the hot side must conduct this heat and the Joule heating ($I^2R$) of the thermoelectric modules). This concept is displayed in FIG. 5.

There are a number of methods which could be employed to attach the thermoelectric modules to protrusions from the plates. A thermal grease could be used as an interface. In particular, this option greatly increases the rework factor in module assembly. Lower thermal resistances are realized if the thermoelectric modules are attached with a thermal epoxy or by solder. However, this fixation method complicates rework operations.

Although the figures shown herein pertain more or less to an air cooled assembly, it is noted that the present invention is equally applicable to liquid cooled assemblies. In fact, as the external resistance decreases the performance of the thermoelectric modules in enhancing the cooling process increases.

From the above, it should be appreciated that the structure of the present invention provides an enhanced method for cooling electronic chips and/or other electrical devices. It is further seen that the performance of thermoelectric devices is significantly enhanced in a manner which is consistent with thermodynamic principles and with ease-of-manufacture considerations.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. An apparatus for cooling an electronic device, said apparatus comprising:

a cold plate for contacting said electronic device, said cold plate having a plurality of flat-faced surface protrusions on the side thereof opposite the side for contacting said electronic device;

a heat removal plate having high surface area heat transfer structures on one side thereof and on the opposite side thereof, having flat-faced surface protrusions having position and structure corresponding to said flat faced protrusions on said cold plate; and at least one thermoelectric heat removal element, each such heat removal element having a hot side and a cold side, said elements being disposed between the respective protrusions of said cold plate and said heat removal plate and in thermal contact with said protrusions, each such heat removal element having its cold side adjacent to a protrusion on said cold plate and its hot side adjacent to a protrusion on said heat removal plates.

2. The apparatus of claim 1 in which said protrusions comprised interdigitated fins.

3. The apparatus of claim 1 in which at least one of said protrusions possess a triangular cross section and are, as between said cold plate and said heat transfer plate, arranged in an interdigitated configuration.

* * * * *